United States Patent [19]

Zollman et al.

[11] Patent Number: 4,944,826
[45] Date of Patent: Jul. 31, 1990

[54] METHOD AND APPARATUS FOR PREPARING A SCREEN PRINTING SCREEN

[75] Inventors: Peter M. Zollman, Walton on Thames; Brendon T. Pollard, Betchworth; Andrew D. Birch, Guildford, all of England

[73] Assignee: ZED Instruments Ltd., Surrey, England

[21] Appl. No.: 233,087

[22] Filed: Aug. 17, 1988

[30] Foreign Application Priority Data

Aug. 17, 1987 [GB] United Kingdom ............... 8719412

[51] Int. Cl.$^5$ .............................................. B41C 1/14
[52] U.S. Cl. .............................. 156/345; 101/128.21; 156/643; 372/24; 250/202; 219/121.68; 219/121.8
[58] Field of Search ............. 101/128.21, 128.4, 401.1; 156/643, 668, 345; 372/24; 369/46; 250/202, 215, 236; 219/121.7, 121.68, 121.8

[56] References Cited

U.S. PATENT DOCUMENTS

| | | | |
|---|---|---|---|
| 3,374,311 | 3/1968 | Hell | 101/401.1 |
| 3,455,239 | 7/1969 | Smith | 101/170 X |
| 3,668,028 | 6/1972 | Short | 101/128.4 X |
| 3,696,741 | 10/1972 | Reinke | 101/121.21 X |
| 3,696,742 | 10/1972 | Parts et al. | 101/128.4 |
| 4,525,826 | 6/1985 | Nakamura et al. | 369/46 |

FOREIGN PATENT DOCUMENTS

| | | | |
|---|---|---|---|
| 2107738 | 8/1972 | Fed. Rep. of Germany | 101/128.4 |
| 56-164 | 1/1981 | Japan | 101/128.4 |
| 61-235151 | 10/1986 | Japan | 101/128.4 |
| 1410344 | 10/1975 | United Kingdom | |

Primary Examiner—Kenneth M. Schor
Attorney, Agent, or Firm—Sughrue, Mion, Zinn, Macpeak & Seas

[57] ABSTRACT

A method of patterning a perforated screen printing screen (9) having a lacquer coating filling its perforations (10), using a laser engraving device, includes the steps of locating the position of the locus of aligned perforations (10), aligning an engraving head (7) of the laser engraving device with the locus of the perforations (10) and then selectively actuating the laser to remove the lacquer individually from those perforations (10) which it is required to unblock. The laser engraving device includes a scanner (1,2) for scanning the laser engraving head (7) over the surface of the screen (9), a detector (8) for detecting the locus of the perforations (10) extending in the scanning direction of the laser engraving head (7) and the location of each perforation (10) in the scanning direction, alignment devices (4, 5, 6) responsive to the output of the detector (8) to align the laser engraving head (7) with the locus of the perforations (10) detected by the detector (8), and a laser actuation control (20, 21, 24) to enable the laser to be actuated only when it is aligned with the individual perforations (10).

9 Claims, 3 Drawing Sheets

AXIS OF CYLINDER →

METHOD AND APPARATUS FOR PREPARING A SCREEN PRINTING SCREEN

BACKGROUND TO THE INVENTION

Screen printing is a printing technique in which ink is squeezed through a patterned, perforated screen onto a substrate. Mainly it is used to print patterns on textiles but it is also used to print on plastics bottles and plastics material to produce signs. Another use is to print conductive ink patterns to produce wiring patterns on printed circuit boards and other devices Screens typically are made of perforated cylindrical sleeves of nickel having a thickness of 0.1 mm, a diameter of between 200 and 400 mm and a length of 1 to 3 meters. Conventionally such screens are coated with a photosensitive lacquer which covers the outer surface of the screen and fills all of its perforations. To produce an ink transmitting pattern the lacquer is exposed to ultraviolet light through a transparent sheet carrying an opaque pattern which is usually a negative resulting from a photographic process. Portions of the photosensitive lacquer which are exposed to ultraviolet light remain after development of the lacquer, whilst the portions of the photosensitive lacquer which lie beneath the opaque regions are not exposed to the ultraviolet light and, during development are removed to open the perforations in the screen. This produces a pattern on the screen of areas which transmit ink and areas which do not transmit ink.

Recently it has been proposed that, instead of using a photographic process to produce a pattern of ink transmitting and non-transmitting regions on the screen they are patterned using a laser engraving device to ablate the lacquer from regions of the screen that are required to transmit ink. Such a technique is disclosed in DE-A-No. 3601327. This technique avoids the need to go through development and washing steps of the screen and enables the screen to be patterned directly from digital data without the need for an intermediate photographic negative. To do this it has been proposed to scan a laser engraving head over the entire surface of a screen with a laser beam being switched on during the time that it is scanning over a region in which ink is to be transmitted and switched off when scanning over a region where ink is not to be transmitted through the resulting screen. Such a laser beam engraving device effectively removes the lacquer and opens up the perforations. However, such techniques are quite slow since the laser beam is scanned over substantially the entire surface of the screen at a uniform speed as the laser beam is turned on and off as required to produce the pattern. Another problem is the generation of moire patterns particularly in half tone regions formed by ablating small, regularly spaced areas of lacquer from the surface of the screen. When the small regularly spaced areas are of a different pitch or arranged at a different angle to the perforations of the screen, a periodic overlap and non-overlap occurs between them and the perforations of the screen which gives rise to areas of high contrast across what is required to be a continuous half-tone region of the pattern. These contrast areas are resolvable by eye in the finished printed product.

In gravure printing a closely spaced array of cells are etched into the surface of the printing member and the depth of the individual cells controls the quantity of ink retained by each cell and hence the density of ink applied to a corresponding area of a printing substrate. Typically the size and spacing of such cells are not resolvable by eye and are very much more closely spaced than the perforations in a screen printing screen. In a prototype system for laser and electron beam engraving of rotogravure cylinders the metal cylinders are pre-engraved with an array of gravure cells which have been engraved to the maximum required depth and then filled with a plastics material such as an epoxy resin. The plastics material is then etched by the application of a laser or electron beam. GB-A-No. 1410344 describes a laser engraving system for engraving such rotogravure cylinders in which a scanning cell detector is located upstream of a laser or electron beam engraving head to detect the location of the engraved cells and a deflector is included in the laser or electron beam engraving head to deflect the beam in two mutually perpendicular directions as the engraving head is scanned over the surface of the printing member so that the beam impinges on the plastics material in the filled cells.

US-A-No. 4525823 describes an optical tracking system in which a reading head is controlled to follow a pre-recorded optical information track. A spot of light is projected onto the track and light reflected and scattered from it is focussed onto two side-by-side photodetectors, the outputs of which are compared and the result used to control the point of projection of the light spot. GB-A-No. 2099614 describes a digital optical disc reader in which a spot of light is projected onto the disc and light reflected from and scattered by information tracks on the disc is collected by a photodetector. The output of the photodetector is filtered and fed to an analysing circuit including a phase locked loop to provide a high frequency component representing a clock signal for information encoded on the track and a low frequency component indicative of any radial modulation resulting from track wobble.

SUMMARY OF THE INVENTION

According to a first aspect of this invention a method of patterning a perforated screen printing screen having a lacquer coating filling its perforations using a laser engraving device includes the steps of locating the position of the locus of aligned perforations in the perforated screen, aligning an engraving head of the laser engraving device with the locus of the perforations and then selectively actuating the laser to remove the lacquer individually from those perforations which it is required to unblock.

According to a second aspect of this invention a laser engraving device for patterning a perforated screen printing screen having a lacquer coating filling its perforations by ablating the lacquer from the screen with a laser beam includes a scanner for scanning a laser engraving head over the surface of the screen, a detector for detecting the locus of the perforations in the screen extending in the scanning direction of the laser engraving head and the location of each perforation in the scanning direction, alignment means responsive to the output of the detector to align the laser engraving head with the locus of the perforations detected by the detector, and means to enable the laser to be actuated only when the laser engraving head is aligned with the individual perforations.

The advantage of the present invention is that the perforations of the screen are unblocked individually since the laser of the laser engraving device is only fired when its engraving head is aligned with a blocked perforation. The detector detects the location of the perforations and then controls the alignment of the laser engraving head directly without the need to use any auxiliary means to deflect the laser beam in either the scanning direction or the direction transverse to the scanning direction. This enables the scanning device to move rapidly from the locus of one row of perforations to the next and enables the laser not to be fired unnecessarily at spaces between the perforations. Accordingly this speeds up the operation of the laser engraving device.

The laser engraving device may be one for engraving a flat screen in which the laser engraving head moves in a raster type scanning pattern over the surface of the flat screen but preferably it is arranged to engrave cylindrical screens and includes a rotary scanner. Such a laser scanning device typically comprises a cylinder for supporting the rotary screen mounted for rotation about its axis by a drive, a carriage carrying the engraving head and detector driven by a lead screw and arranged to move along the cylinder in an axial direction, the lead screw also including a rotary drive mechanism. Typically the cylinder drive includes an angular position encoder.

The detector may be mounted upstream in the scanning direction of the laser engraving head and, in this case the detector is arranged at a predetermined angular orientation in advance of the laser engraving head and the output of the angular position encoder of the cylinder is used to clock the means to enable the laser to be actuated in dependence upon the angular relationship between the detector and the laser engraving head.

Preferably the detector is an optical detector which illuminates the surface of the screen over an area containing a few perforations and images the surface of the screen onto a pair of photodetectors arranged side by side transverse to the scanning direction. As the detector is scanned over the surface of the screen it will observe apparent bright bands of the screen caused by reflection from the surface of the screen between adjacent perforations. By low pass filtering the signal from the photodiodes high frequency components of the output from the photodiodes which are responsive to the location of individual perforations are filtered from their outputs and hence, only a signal due to the bright image of the locus of the screen between the perforations and hence the locus of the perforations remains. This locus is tracked by the drive to the lead screw being operated in response to the differential output of the two photodetectors to maintain a zero differential output between the two photodiodes and hence maintain the centre of the bright stripe in the middle of the two photodetectors. The circumferential location of each of the perforations is detected by taking the signals from both photodetectors through a high pass filter to remove the low frequency component and leave only those components due to the individual perforations. The signals from both photodetectors are added together to provide an enabling pulse corresponding to every perforation passing the optical detector. Preferably the high pass signal is fed to a phase locked loop to lock the output of the enabling signal to the detected circumferential spacing of the perforations to take account of any perforations that are missed as a result of noise or other interference.

As a result of ablating the lacquer from individual perforations half tones in the pattern to be printed by the screen are produced by ablating the lacquer from one to five of the perforations in each group of adjacent six perforations, for example. Corresponding perforations are ablated in each group and this provides a half tone pattern without any moire effect whatsoever. Full tones are produced by ablating the lacquer from all of the perforations. Further graduation of the half tones can be achieved by only ablating part of the lacquer from each perforation. By enabling the laser of the laser engraving device after an initial delay so that the perforation has at least partly moved past the laser engraving head before a laser beam is emitted, the lacquer is only ablated from the downstream part of the perforation. Assuming that, in this way, the lacquer is only removed from half of the area of each perforation this doubles the number of half tones that can be produced.

BRIEF DESCRIPTION OF THE DRAWINGS

A particular example of a method and apparatus in accordance with this invention will now be described with reference to the accompanying drawings.

DESCRIPTION OF PREFERRED EXAMPLE

Figure 1:
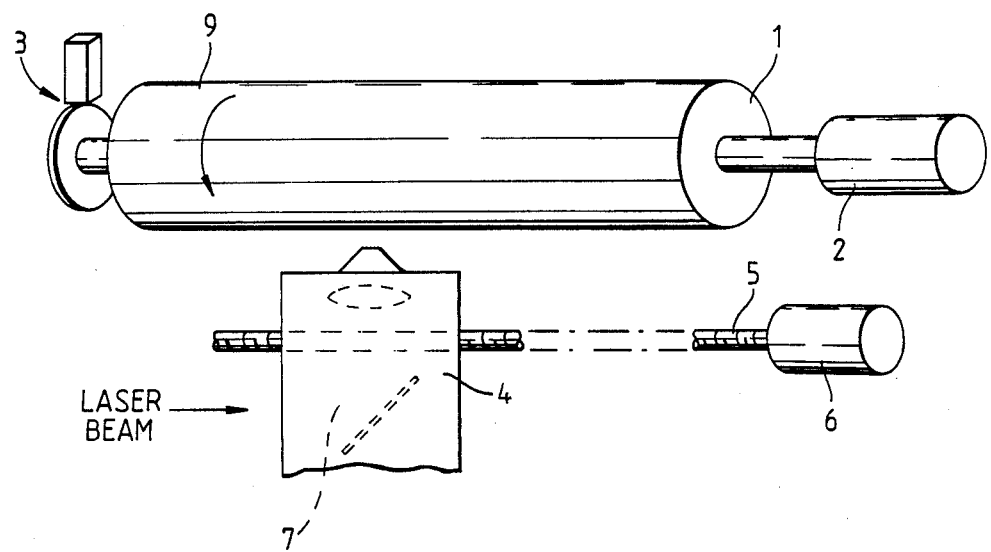
FIG. 1 is a diagrammatic perspective view of the laser engraving device.

The laser engraving machine comprises a cylinder 1 for carrying a rotary screen. The cylinder 1 is mounted for rotation about its longitudinal axis by a motor 2 and includes an angular position encoder 3 to monitor its angular position. A carriage 4 is mounted on a slideway (not shown) parallel to the axis of the cylinder 1. The carriage is driven backwards and forwards along the slideway by a lead screw 5 which in turn is driven by a stepping motor 6. A laser engraving head 7 typically comprising a mirror and a focussing lens surrounded by an annular vacuum debris removal system (not shown) is mounted on the carriage 4 as is an optical detector 8 which will be described in more detail subsequently. The engraving machine also includes a carbon dioxide laser (not shown) which provides a high power infrared laser beam which impinges on the mirror of the engraving head 7.

Figure 4:
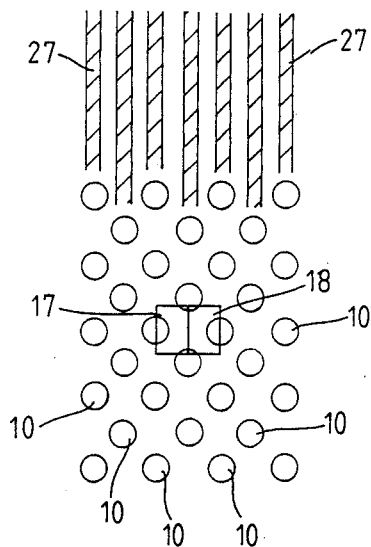
FIG. 4 is a plan view to a much enlarged scale of a portion of the perforated screen; and, FIG. 5 is a block circuit diagram of a control circuit.

A generally cylindrical perforated nickel screen 9 is mounted on the cylinder 1. The screen 9 is shown most clearly in FIG. 4 and includes closely packed perforations 10 arranged in an array. In practice, the perforations 10 are usually arranged around a single or multistart helical path. The surface of the screen is coated with an ink impermeable lacquer and this fills the perforations 10. Conventionally the lacquer is formed by a photosensitive emulsion but when used with a laser engraving device it is sufficient if the lacquer is ablatable by a laser, hard wearing, capable of adhering firmly to the screen and impervious to the ink subsequently to be used for printing through the screen 9.

In use, the cylinder 1 and screen 9 are rotated, usually at a constant velocity by the motor 2 and with the carriage 4 initially at one extreme axial end of the screen. The carriage is moved axially along the screen 9 by the lead screw 5 and its motor 6 with the laser being actuated to ablate the lacquer from particular perforations 10 to produce a predetermined pattern of perforations in the screen through which ink can pass. The pattern of perforations selected may provide a full tone, a half tone or may provide a distinctive pattern which is resolvable by eye in the final printing depending upon the choice of pattern data used to drive the laser.

Figure 2:
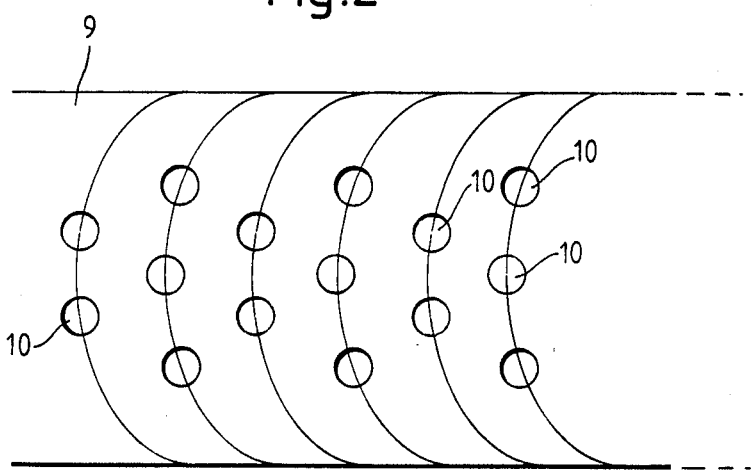
FIG. 2 is a diagrammatic view illustrating the track of the laser engraving head over the perforated screen.
Figure 3:
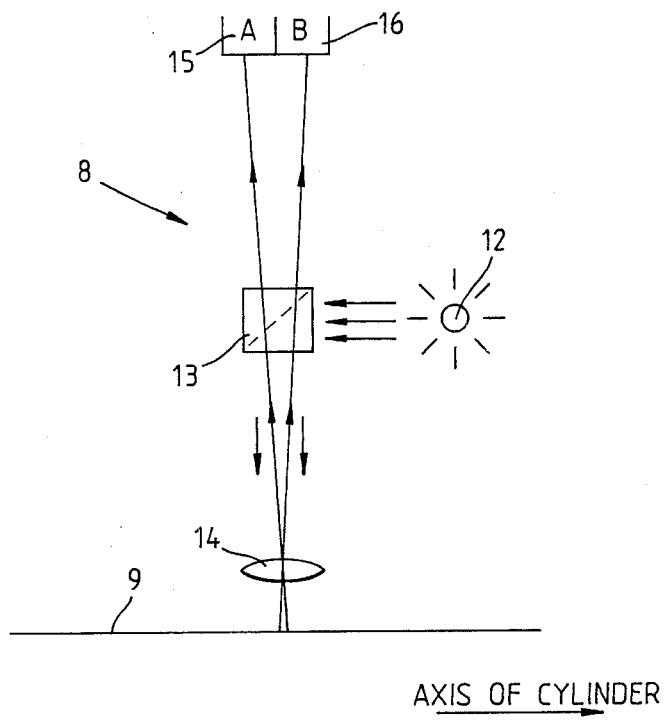
FIG. 3 is an optical diagram of the perforation detector.

As the cylinder 1 is rotated and the carriage 4 moves axially along the cylinder the laser engraving head describes a generally helical track over the surface of the screen 9 as illustrated in FIG. 2. The optical detector 8 which is mounted upstream from the laser engraving head 7 in the scanning direction detects the position of the circumferentially extending locus of the perforations 10 of the screen 9 and control circuits, to be described subsequently, align axially the laser engraving head with the circumferentially extending locus of the perforations 10 by shifting the carriage 4 along the slideway by means of the lead screw 5 and motor 6. In this way the laser engraving head 7 is arranged to track the circumferentially extending lines of perforations as shown in FIG. 2 so that no time is wasted covering portions of the screen 9 which do not contain perforations. Naturally, if the pattern does not require any perforations to be unblocked over a complete annular region or the screen, the motor 6 may drive the lead screw 5 and move the carriage 4 rapidly onto the next region where unblocked perforations are required.

The optical detector 8 comprises a light source 12, a beam splitter 13 which reflects light from the light source 12 through an objective lens 14 evenly to illuminate the surface of the screen 9. The objective lens 14 focuses an image of the surface of the screen 9 via the beam splitter 13 onto the active surfaces of a pair of photodiodes 15 and 16. The photodiodes 15 and 16 typically "see" a region such as regions 17 and 18 shown in FIG. 4. Light from the light source 12 is reflected more from the and of the screen 9 than from the perforations 10 and consequently the photodetectors 15 and 16 receive greater amount of light when they are aligned with the land between four adjacent perforations 10, as shown by the regions 17 and 18 in FIG. 4, than when their field of view contains perforations 10. By processing the signal obtained from the photodiode it is possible to distinguish both the locus of the perforations 10 in each circumferentially extending line and hence the axial location of the locus of a column of perforations and also possible to detect the circumferential location of each perforation 10 in each column.

Figure 5:
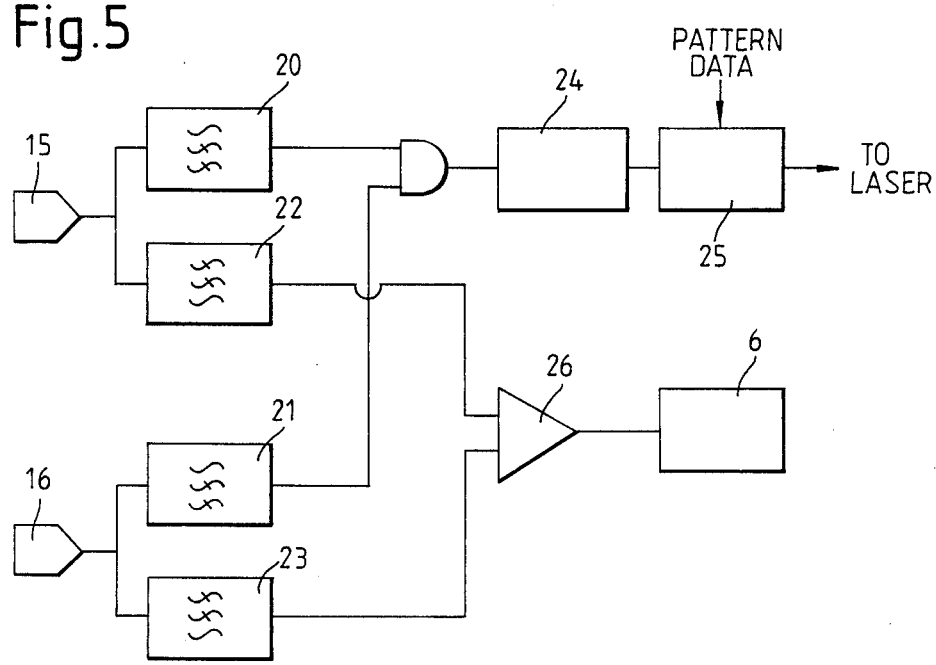

FIG. 5 illustrates a simplified block diagram of such a signal processing circuit which comprises high pass filters 20 and 21 and low pass filters 22 and 23 connected to the outputs of photodetectors 15 and 16, respectively. The filtered high frequency components are combined and fed to a phase locked loop 24 and then as an enabling signal to a laser control circuit 25 which also receives pattern data with regard to the pattern to be applied to the screen. The outputs from the low pass filters 22 and 23 are compared in comparator 26 and an error signal output from comparator 26 is fed to the lead screw motor 6 to cause movement of the lead screw 5 and hence forward movement of the carriage 4 to align the detector 8 and hence the laser engraving head with a circumferential line of perforations 10. As a result of the lands between adjacent perforations 10 in the circumferential direction reflecting more of the light than the perforations 10 these regions average out to give brighter stripes 27, see FIG. 4, than the remainder. The brighter stripes occur at axial positions corresponding to the locus of the line of perforations 10 extending in the circumferential direction. By low frequency filtering the outputs of the photodetectors 15 and 16 in filters 22 and 23 outputs representing these brighter stripes 27 are obtained. These low frequency components are then compared in comparator 26 and the result of this is used to centre the joint between the two photodetectors onto the locus of the perforations 10 in each circumferential line. Equally, the high frequency components of the outputs of photodetectors 15 and 16 correspond to the location of the individual perforations 10 and these, after being applied to the phase locked loop 24 which locks on to the repetition frequency at which perforations 10 are passing the detector 8, enable the laser so that it is fired only when a perforation 10 is present. Of course the laser is also enabled by the requirement for a perforation at that location as defined by the pattern data. The output of the angular position encoder 3, bearing in mind the angular relationship between the detector 8 and the laser engraving head, is used to clock the triggering of the laser pulses to ablate the perforations 10.

We claim:

1. In a laser engraving device for patterning a perforated screen printing screen having a lacquer coating filling its perforations by ablating said lacquer from said screen with a laser beam, said laser engraving device including a laser engraving head, and a scanner for scanning said laser engraving head over said screen printing screen, the improvement wherein said laser, engraving device includes a detector for detecting a locus of perforations in said screen printing screen extending in a scanning direction of said laser engraving head and a location of each of said perforations in said scanning direction and providing an output, alignment means operatively connected to said detector and said laser engraving head and responsive to said output of said detector to align said laser engraving head with said locus of said perforations detected by said detector, and enabling means to enable said laser engraving device to be actuated only when said laser engraving head is aligned with an individual one of said perforations.

2. The laser engraving device of claim 1, wherein said scanner comprises a cylinder for supporting said screen printing screen, a drive for rotating said cylinder about its axis, a carriage, said engraving head and said detector being mounted on said carriage, a lead screw, said lead screw being operatively connected to said carriage, a rotary drive mechanism for said lead screw to rotate said lead screw and in turn move said carriage along said cylinder in an axial direction, and an angular position encoder connected to said cylinder drive.

3. The laser engraving device of claim 2, wherein said detector is mounted upstream in said scanning direction of said laser engraving head and, wherein said detector is arranged at predetermined angular orientation in advance of said laser engraving head, said angular position encoder providing an output to clock said enabling means to enable said laser engraving device to be actuated in dependence upon the angular relationship between said detector and said laser engraving head.

4. The laser engraving device of claim 1, wherein said detector is an optical detector which illuminates a surface of said screen over an area containing a few of said perforations and images said surface of said screen onto a pair of photodetectors arranged side by side transverse to said scanning direction and arranged to produce an output in response to said image of said surface.

5. The laser engraving device of claim 4, wherein low pass filters are included which are operatively connected to the output of said photodetectors to remove high frequency components of said output of said photodetectors to provide a signal corresponding to a bright image of the locus of said screen between said perforations and hence said locus of said perforations.

6. The laser engraving device of claim 4, wherein high pass filters are included which are operatively connected to the output of said photodetectors to remove low frequency components of said output of said photodetectors and thereby provide a signal representing only components due to the individual perforations, said enabling means including an adder to add together filtered signals from both said photodetectors to provide an enabling pulse corresponding to every perforation passing said optical detector.

7. The laser engraving device of claim 5, wherein high pass filters are included which are operatively connected to the output of said photodetectors to remove low frequency components of said output of said photodetectors and thereby provide a signal representing only components due to the individual perforations, said enabling means including an adder to add together filtered signals from both said photodetectors to provide an enabling pulse corresponding to every perforation passing said optical detector.

8. The laser engraving device of claim 6, wherein said enabling means also includes a phase locked loop to lock said enabling pulse to the detected circumferential spacing of said perforations.

9. The laser engraving device of claim 7, wherein said enabling means also includes a phase locked loop to lock said enabling pulse to the detected circumferential spacing of said perforations.

* * * * *